US006448873B1

(12) United States Patent
Mostov

(10) Patent No.: US 6,448,873 B1
(45) Date of Patent: Sep. 10, 2002

(54) LC FILTER WITH SUSPENDED PRINTED INDUCTOR AND COMPENSATING INTERDIGITAL CAPACITOR

(75) Inventor: Alexander Mostov, Rishon Letzion (IL)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/542,603

(22) Filed: Apr. 4, 2000

Related U.S. Application Data

(63) Continuation-in-part of application No. 09/004,777, filed on Jan. 9, 1998, now Pat. No. 6,175,727.

(51) Int. Cl.$^7$ ................................................ H03H 7/01
(52) U.S. Cl. ........................................ 333/185; 333/184
(58) Field of Search ................................ 333/167, 184, 333/185

(56) References Cited

U.S. PATENT DOCUMENTS

| | | | | |
|---|---|---|---|---|
| 5,618,777 A | * | 4/1997 | Hey-Shipton et al. | .. 333/185 X |
| 5,929,729 A | * | 7/1999 | Swarup | ................... 333/185 X |
| 5,959,515 A | * | 9/1999 | Cornett et al. | .......... 333/185 X |

OTHER PUBLICATIONS

"Analysis, Design, And Optimization Of Spiral Inductors And Transformers For Si RF IC's", Ali M. Niknejad, et al., IEEE Journal of Solid–State Circuits, vol. 33, No. 10, Oct. 1998, pp. 1470–1481.

"Large Suspended Inductors on /Silicon and Their Use In A 1–$\mu$M CMOS RF Amplifier", J. Y.–C. Chang, et al., IEEE Electron Device Letters, vol. 14, No. 5, May 1993, pp. 477–479.

"High Q Inductors For Wireless Applications In A Complementary Silicon Bipolar Process", K. B. Adhby, et al., Bipolar/BiCMOS Circuits and Technology Meeting, 1993, pp. 480–483.

"Microstrip Lines and Slotlines", Artech House, Inc., 1996, pp. 132–135.

(List continued on next page.)

Primary Examiner—Justin P. Bettendorf
(74) Attorney, Agent, or Firm—Ronald O. Neerings; Wade James Brady III; Frederick J. Telecky, Jr.

(57) ABSTRACT

A suspended printed inductor (SPI) connected in parallel to a suspended interdigital capacitor (SIC) so as to form a parallel resonant circuit that is nearly independent of variations in PCB etching tolerances. This combination of SPI and SIC functions to resonate at a center frequency and with similar parallel resonant circuits can be used to form RF filters having any desired order. Using the parallel resonant combination of SPI and SIC, a RF filter can be constructed whose electrical properties are nearly insensitive to variations in PCB parameters and etch processing. The sensitivity of the spiral suspended printed inductor in combination with the suspended printed interdigital capacitor to PCB parameters such as dielectric constant and PCB height is greatly reduced. Further, the parallel combination of suspended printed spiral inductor and suspended interdigital capacitor is nearly insensitive to PCB etching tolerances. SPIs and SICs are characterized by the absence of a ground plane. Low cost RF filters can be formed over any suitable substrate material, such as a dielectric substrate, with greatly reduced effects on filter performance due to the variations in PCB height, trace width and PCB material.

31 Claims, 6 Drawing Sheets

OTHER PUBLICATIONS

"Microstrip Interdigital Capacitor (2–port)", Microstrip Elements, Hewlett Packard EESOF User Guide, Circuit Network Items, Hewlett Packard Company, Jul. 1995, pp. 10–34/10–35.

"MMIC Design", The Institution of Electrical Engineers, 1995, pp. 74–77.

"On–Chip Spiral Inductors with Patterned Ground Shields for Si–Based RD IC's", C. Patrick Yue, et al., IEEE Journal of Solid–State Circuits, vol. 33, No. 5, pp. 743–751.

"RF Circuit Design Aspects of Spiral Inductors on Silicon", IEEE Journal of Solid–State Circuits, vol. 33, No. 12, pp. 2028–2033, Dec. 1998.

"Spiral Inductor Substrate Loss Modeling In Silicon RFICs", William b. Kuhn, et al., Microwave Journal, pp. 66–67, 70, 73–74, 76, 79, and 81, Mar. 1999.

* cited by examiner

LC FILTER WITH SUSPENDED PRINTED INDUCTOR AND COMPENSATING INTERDIGITAL CAPACITOR

REFERENCE TO RELATED APPLICATION

This application is a Continuation-In-Part of U.S. sppli-cation Ser. No. 09/004,777, filed Jan. 9, 1998 now U.S. Pat. No. 6,175,727 B2 entitled "Suspended Printed Inductor And LC-Type Filter Constructed Therefrom," incorporated herein by reference in its entirety.

FIELD OF THE INVENTION

The present invention relates generally to printed filters and more particularly relates to LC-type printed circuit filters realized using a parallel resonant combination of suspended printed inductor and suspended interdigital capacitor that may be formed over any dielectric substrate.

BACKGROUND OF THE INVENTION

Wireless radio frequency (RF) communications are becoming more and more prevalent in the world today. Products touting wireless RF communication links are becoming increasingly popular among consumers. A multitude of new products including redesigned existing ones is being built with wireless RF links today. Most RF communication circuits employ some form of resonant circuitry in their transceivers. Due to the explosive consumer demand for products sporting wireless communication links there is a need for low cost, high accuracy and high reliability filters that are suitable for mass manufacture using conventional techniques.

RF filters are necessary circuits in transmitters and receivers that operate in a both wireless and non-wireless, i.e., cable, environments. In a transmitter, the amount of suppression that an RF filter must provide is determined by regulatory requirements or by the amount of interference that the transmitter might cause as a result of unwanted spectral components. RF filters are even more essential in receivers of communications systems especially when the communications system is wireless and is likely to suffer from reception of interfering signals in addition to the natural (thermal) reception noise. In a receiver, the quality of the filtering dramatically effects the reception performance, especially when considering certain types of interference. A particular receiver may deliver an output of degraded quality (i.e., higher error rate in a digital receiver, or severe signal distortions in an analog receiver), if the frequency response of its filters is compromised.

When defining the filtering requirements in a receiver, the following factors should be considered: (1) the frequency band in which the receiver is to operate, (2) the frequency conversions and IF to be used, (3) the spectrum of the modulated signal to be demodulated by the receiver and (4) the nature of any interfering signals to be encountered and the associated rejection requirements.

The filter preceding the demodulator would normally be the narrowest and should allow the minimum amount of additive noise and interference to enter the demodulator. Its bandwidth is normally close to that of the modulated signal for which the receiver was designed. The selectivity of the receiver, i.e., the rejection of adjacent frequencies that may cause jamming or performance degradation, is determined by the steepness of the frequency response curve of the filter.

In a single frequency receiver, such as in the case of simple pagers, the narrow filter may precede most of the electronic circuitry of the receiver, thus reducing the possibility of intermodulation produced within the receiver. In receivers intended for an entire band of frequencies, from which one frequency among many is in use at any one time, the filtering at the input of the receiver usually has a bandwidth at least as wide as that of the entire band used. These filters cannot provide rejection for in band interference and usually do not have significant attenuation even for out of band frequencies that are close to the edges of the band. In such receivers, the IF filtering provides effective rejection of such interference as long as an inband intermodulation product was not generated before the signal reaches the narrow IF filtering.

The wide filters located at the input to the receiver are intended to provide image rejection and out of band interference rejection, which is effective for signals sufficiently far from the edges of the frequency band. A typical filter, e.g., surface acoustic wave (SAW) filter, for use in the 900 MHz ISM band, for example, costs over $1.00 and has a frequency response with limited out of band attenuation.

Most RF filters and circuits for communication applications make use of one or more inductors in their design. Previously, these were lumped inductors or printed inductors that have been formed on printed circuit boards using a variety of techniques such as stripline, microstrip, slotline, etc. Inductors formed using any of these techniques are typically constructed in the form of a planar spiral with the spiral being circular or square in shape. A disadvantage, however, of forming inductors, such as microstrip inductors, on printed circuit boards is that they are very sensitive to the characteristics of the printed circuit board material. The characteristics of the printed circuit board material directly affect the characteristics and performance of the inductors formed thereon. Parameters of the PCB material such as thickness and dielectric constant affect the characteristics of the inductor. The sensitivity of microstrip inductors to the dielectric constant of the printed circuit board material results in variations in the resultant self-resonant frequency. In addition, variations in the thickness of the PCB material causes variations in the value of the inductance that results in frequency response errors of any filter constructed therefrom.

Another disadvantage of constructing printed inductors on printed circuit boards using traditional techniques is that the repeatability of the value of the inductance is too low for mass production. As described above, the characteristics of the inductor are very sensitive to the parameters of the printed circuit board material. In addition, most printed circuit inductors constructed utilizing conventional techniques have limited values of the quality factor Q of the inductor. This is due to the nature of the conventional inductor that is constructed having a ground plane. Further, since the ground plane is separated from the printed inductor traces by the printed circuit board material there is typically significant parasitic capacitance between the inductor and the underlying ground plane. In some applications, this parasitic capacitance can be problematic because it causes a reduction in the self-resonant frequency of any LC combination formed using the inductor.

An alternative to using printed circuit inductors, such as microstrip and stripline inductors, is to use discrete inductor elements. A disadvantage, however, of using discrete elements is the high cost typically associated with high Q lumped coils.

A limitation, however, of the use of filters that utilize printed inductors is the sensitivity of the center frequency and other filter characteristics to variations in the PCB etching process. One means of compensation is to design wider filters to accommodate the PCB etching tolerances. This, however, is not always a viable solution, as the requirements of the particular application may demand sharp narrow filters.

Another prior art solution to realizing filters with invariable center frequencies is to use precise PCB etching techniques. High precision PCB manufacturing, however, entails higher manufacturing costs.

The effect of underetching of the traces results in a lower inductance value due to less magnetic flux linkage since there is less space for the magnetic field in between the traces. Conversely, overetching results in a higher inductance for the opposite reason. For example, a variation in trace width (e.g., 8 mil rather than the desired 10 mil) of 2 mil may result in a center frequency deviation of 2% (or a 20 MHz error in the desired center frequency of a 900 MHz band filter). In practice, variations in PCB etching tolerances may result in a filter having a variation in center frequency of 3%. Furthermore, the bandwidth of such a filter may be extended from 28 MHz to 45 MHz. In the ISM bands allowed by the FCC for unlicensed operation, for example, such a filter is too wide to sufficiently filter out unwanted signals from outside the desired band.

SUMMARY OF THE INVENTION

The present invention is a suspended printed inductor (SPI) connected in parallel to a suspended interdigital capacitor (SIC) so as to form a parallel resonant circuit that is nearly independent of variations in PCB etching tolerances. This combination of SPI and SIC functions to resonate at a center frequency, and with similar parallel resonant circuits can be used to form RF filters having any desired order. Using the parallel resonant combination of SPI and SIC, an RF filter can be constructed whose electrical properties are nearly insensitive to variations in PCB parameters and etch processing. The sensitivity of the spiral suspended printed inductor, in combination with the suspended printed interdigital capacitor, to PCB parameters such as dielectric constant and PCB height, is greatly reduced. Further, the parallel combination of suspended printed spiral inductor and suspended interdigital capacitor is nearly insensitive to PCB etching tolerances.

The inductance of the SPI is inversely proportional to its trace width. The wider the trace (which may be caused by underetching), the lower the magnetic flux surrounding the trace and hence, the lower the inductance. The lower the inductance, the higher the resonant frequency. Conversely, the narrower the trace (which may be caused by overetching), the higher the magnetic flux surrounding the trace and hence, the higher the inductance. The higher the inductance, the lower the resonant frequency.

The capacitance of the SIC, on the other hand, is directly proportional to its trace width. The wider the trace, the smaller the distances between the fingers of the capacitor and hence, the higher the capacitance. The higher the capacitance, the lower the resonant frequency. Conversely, the narrower the trace, the larger the distances between the fingers of the capacitor and hence, the lower the capacitance. The lower the capacitance, the higher the resonant frequency.

Thus, the effects of over and underetching on the inductance of the SPI are inversely related to those of the capacitance of the SIC. The effects on the SPI and SIC can be combined in a parallel fashion such that they complement and annul each other. The parallel combination of SPI and SIC can be constructed such that the resonant frequency is nearly independent of the trace width. Thus, the center frequency and the bandwidth of an RF filter (e.g., low pass, high pass, band pass or band stop) constructed therefrom can be adapted, utilizing suitable parallel resonant circuits comprised of SPI and SIC components, to be nearly independent of variations in the PCB etching process.

The basic element of the printed filter of the present invention is the suspended printed inductor (SPI) and suspended interdigital capacitor (SIC). A characteristic feature of a SPI and SIC is that their ground planes are effectively removed. A metal shield connected to ground may be used, e.g., a metal shield surrounding the circuit board, but it is placed at a sufficient distance form the printed circuit board such that the distance can be considered virtual infinity from an RF perspective.

The parallel resonant combination of SPI and SIC can be utilized to construct numerous types of filters such as low pass, high pass, band pass, band stop or any combination thereof. In each case, the filter can be used in lumped or semi-lumped networks together with different types of capacitors such as SMD ceramic, thin film printed or interdigital printed capacitors.

The parallel resonant combination of SPI and SIC has many advantages which are briefly outlined below. First, the use of the SPI with a parallel SIC functions to greatly reduce the effects of variations in the trace widths caused by variations in the PCB etching process. As described hereinabove, the effect of variations in trace widths may result in unacceptable variation in filter parameters, e.g., center frequency, bandwidth, etc.

Second, a suspended printed inductor has a high quality factor Q even when constructed using low cost printed circuit board (PCB) materials. A quality factor Q can be achieved that is up to ten times that of a microstrip inductor implemented on the same material.

Third, suspended printed inductors have improved repeatability of the inductance value. Since there is no ground plane under the printed inductor, sensitivities to PCB material characteristics such as thickness and dielectric constant, are eliminated. The variation of the inductance value of an SPI, i.e., the tolerance, due to the ground plane distance can be reduced to less than 1%, which helps to eliminate the need for trimming or tuning during production.

Fourth, the self-resonance frequency of a suspended printed inductor is typically much higher than that of a microstrip inductor. This is due to the low parasitic capacitance of suspended printed inductors. A low parasitic capacitance is achieved by increasing the distance to the ground plane or by removing it altogether, which functions to reduce the effective dielectric constant value of the inductor. This permits higher inductance values to be achieved while maintaining a safe frequency distance from the self-resonant frequency of the inductor.

Fifth, suspended printed inductors are cheaper to manufacture when compared to the use of lumped elements. SPIs serve to eliminate the high costs of high Q lumped coils by replacing them with printed patterns of negligible cost on a printed circuit board.

There is thus provided in accordance with the present invention a suspended printed resonant circuit comprising a substrate onto which circuit elements can be printed, a first electrically conductive trace printed onto the substrate, the first electrically conductive trace shaped so as to form an inductor at the high radio frequencies of interest, a second electrically conductive trace printed onto the substrate, the second electrically conductive trace shaped so as to form an interdigital capacitor at the high radio frequencies of interest, the interdigital capacitor electrically connected in parallel to the inductor so as to form a parallel resonant circuit, the resonant frequency of the parallel resonant circuit being substantially independent of variations in the width of the first electrically conductive trace and the second electrically conductive trace and wherein an area of the substrate underlying the first electrically conductive trace and the second electrically conductive trace is devoid of electrical traces, including power, ground and signal traces.

There is also provided in accordance with the present invention a radio frequency (RF) filter having an input and an output, the filter for filtering an input signal to yield an output signal therefrom, the filter comprising a substrate onto which circuit elements can be printed, a filter circuit comprising N poles and N zeros wherein each pole and each zero comprises a parallel resonant circuit comprising a suspended printed inductor in parallel with a suspended interdigital capacitor, wherein the resonant frequency of the parallel resonant circuit being substantially independent of variations in the width of the traces used to construct the suspended printed inductor and the suspended interdigital capacitor, coupling means for electrically coupling the N poles and the N zeros to one another in daisy chain fashion, input coupling means for coupling the input signal to the filter circuit, output coupling means for coupling the filter circuit to the output thus forming the output signal and wherein N is a positive integer greater than or equal to one.

There is further provided in accordance with the present invention a method of fabricating a suspended printed resonant circuit, the method comprising the steps of providing a substrate onto which circuit elements can be printed, printing onto the substrate, a first electrically conductive trace using standard lithographic techniques such that the first electrically conductive trace functions as an inductor at the RF frequencies of interest and printing onto the substrate, a second electrically conductive trace using standard lithographic techniques such that the second electrically conductive trace functions as an interdigital capacitor at the RF frequencies of interest and such that the interdigital capacitor is electrically connected in parallel to the inductor so as to form a parallel resonant circuit and creating an area on the substrate substantially underlying the first electrically conductive trace and the second electrically conductive trace that is devoid of electrical traces, including power, ground and signal traces.

BRIEF DESCRIPTION OF THE DRAWINGS

The invention is herein described, by way of example only, with reference to the accompanying drawings, wherein.

DETAILED DESCRIPTION OF THE INVENTION

| DETAILED DESCRIPTION OF THE INVENTION Notation Used Throughout The following notation is used throughout this document. | |
|---|---|
| Term | Definition |
| IC | Integrated Circuit |
| IF | Intermediate Frequency |
| ISM | Industrial Scientific Medial |
| LTCC | Low Temperature Co-fired Ceramic |
| MIM | Metal Insulator Metal |
| PCB | Printed Circuit Board |
| RF | Radio Frequency |
| SAW | Surface Acoustic Wave |
| SIC | Suspended Interdigital Capacitor |
| SMD | Surface Mounted Device |
| SPI | Suspended Printed Inductor |

General Description

Figure 1:
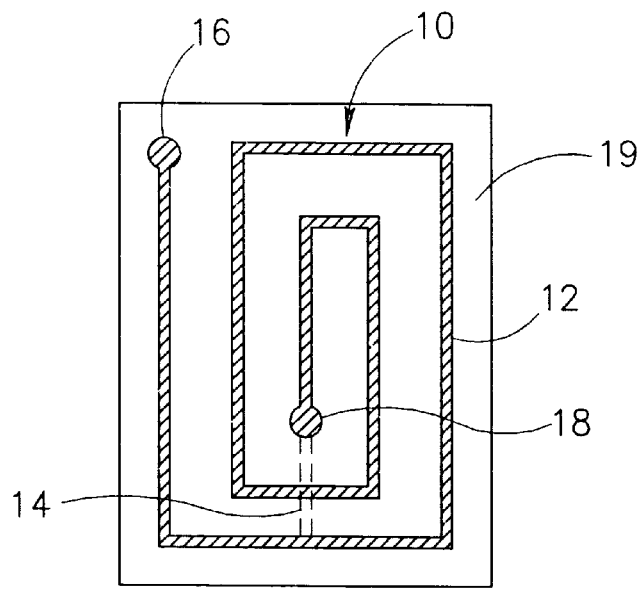
FIG. 1 is a diagram illustrating the top plan view of a suspended printed inductor constructed in accordance with the present invention.

A diagram illustrating the top view of a suspended printed inductor constructed in accordance with the present invention is shown in FIG. 1. The suspended printed inductor (SPI), generally referenced 10, is an inductor that is formed by printing an electrical conductive trace on an insulating material such as a printed circuit board (PCB) in similar fashion to a microstrip inductor with the exception that the SPI inductor does not have a ground plane or its ground plane is located at a distance large enough to be considered virtual infinity.

The SPI 10 comprises an electrically conductive trace 12 formed on one layer of a substrate material 19, which in this example is a printed circuit board. The electrically conductive trace can comprise any suitable conductor such as copper, aluminum or alloys thereof. Terminals 16, 18 form the two terminals of the SPI 10. Trace 14, indicated in FIG. 1 as a dashed line, is located on the opposite side of the printed circuit board 19 from the side that inductor trace 12 is printed on. Terminal 18 can be connected to trace 14 by a via hole. To form the SPI 10, the side of PCB 19 opposite that of trace 12 is devoid of a ground plane. Only a relatively narrow signal trace 14 is placed on the other side of the PCB. The elimination of the ground plane is in direct contrast to the conventional microstrip inductor that is constructed with a ground plane on one side of the PCB.

Figure 2:
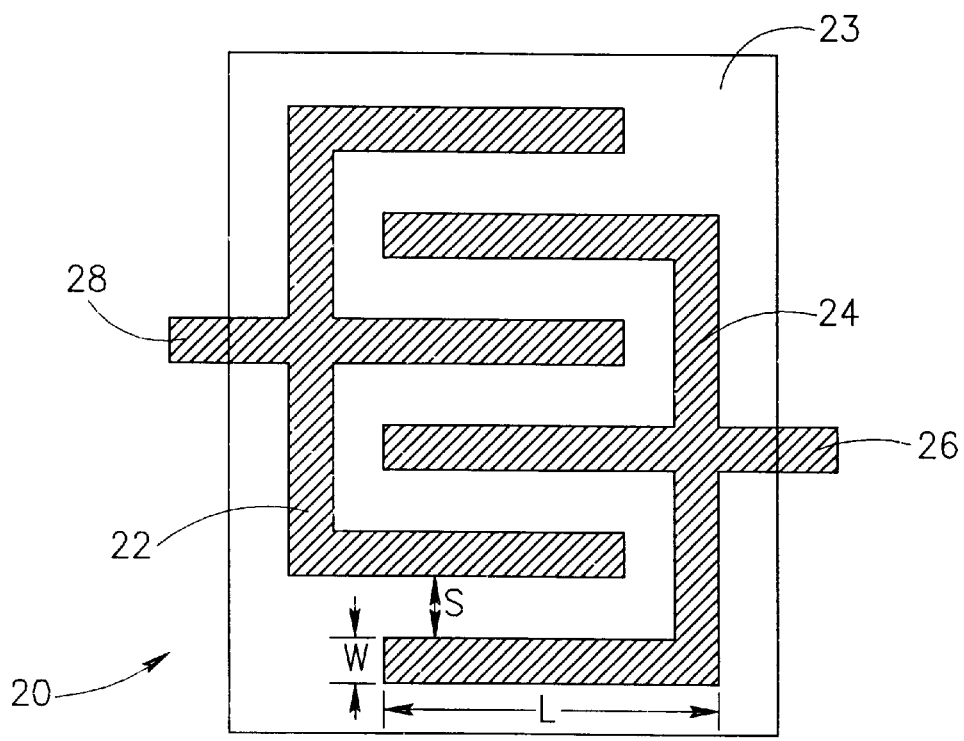
FIG. 2 is a diagram illustrating the top plan view of a suspended printed interdigital capacitor constructed in accordance with the present invention.

A diagram illustrating the top plan view of a suspended printed interdigital capacitor constructed in accordance with the present invention is shown in FIG. 2. The suspended interdigital capacitor (SIC), generally referenced 20, is a microstrip interdigital capacitor that is formed by printing an electrical conductive trace on an insulating material such as a printed circuit board (PCB) in similar fashion to a microstrip interdigital capacitor with the exception that the SIC does not have a ground plane or its ground plane is located at a far enough distance to be considered virtual infinity.

The SIC 20 comprises two electrically conductive sets of digits or fingers 22, 24 formed on one layer of a substrate material 23, which in this example is a printed circuit board. The properties of the SIC are largely determined by the width W, spacing S and length L. The capacitance of the SIC is derived from the fringe capacitance between the fingers, a phenomena well known in the RF arts.

The SIC can be constructed using any suitable technology such as: (1) standard PCB technologies such as FR4 or polyimide, (2) high end PCB technologies such as Alumina hybrids or Low Temperature Cofired Ceramic (LTCC) technology, or (3) in integrated circuit form including silicon or GaAs integrated circuits.

The electrically conductive fingers 22, 24 may comprise any suitable conductor such as copper, aluminum or alloys thereof. Terminals 26, 28 form the two terminals of the SIC 20. To form the SIC 20, the side of PCB 23 opposite that of digits 22, 24 is devoid of a ground plane. The elimination of the ground plane is in direct contrast to the conventional microstrip interdigital capacitor that is constructed with a ground plane on one side of the PCB. Note that the SIC is depicted showing three fingers on each portion 22, 24 for illustration purposes only. Depending on the application, a SIC having any desired number of fingers may be constructed whereby the capacitance increases as the number of fingers N increases.

Figure 3:
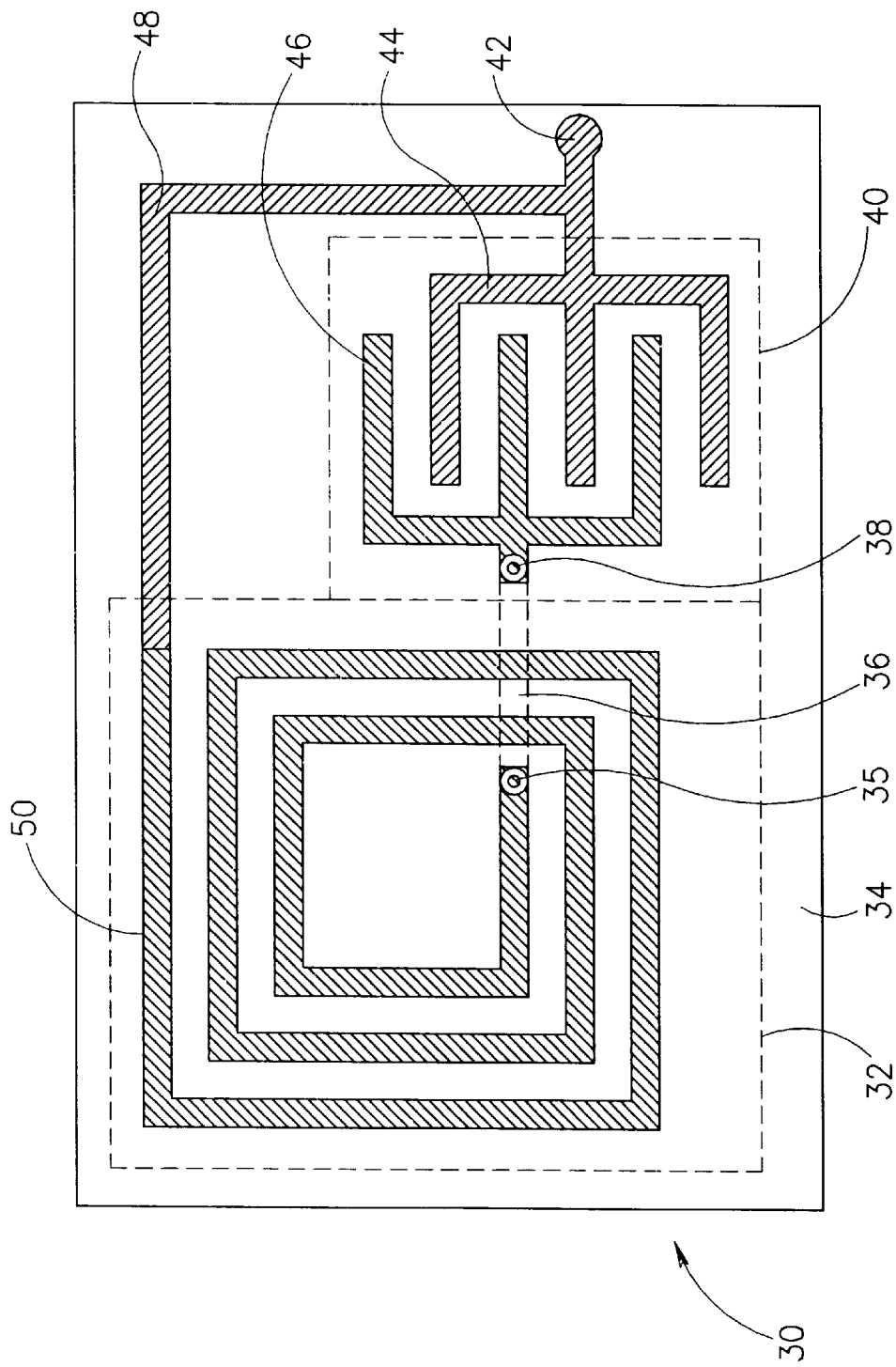
FIG. 3 is a diagram illustrating a top plan view of the parallel combination of a suspended printed inductor and interdigital capacitor constructed in accordance with the present invention.

Suspended printed inductors can be used to form low cost, high Q filters. In order to reduce the sensitivity of filters constructed using SPIs to variations in PCB etching tolerances and to PCB parameters, the present invention combines the SPI in parallel with a SIC. A diagram illustrating a top plan view of the parallel combination of a suspended printed inductor and interdigital capacitor constructed in accordance with the present invention is shown in FIG. 3.

The parallel combination, generally referenced 30, comprises a SPI 32 and SIC 40 connected together in parallel fashion. The SPI 32 comprises trace 50 that starts at one end and spirals inwardly to via 35. The signal trace continues on the opposite side of the PCB 34 to via 38 where it connects with one of the digits 46. The second digit 44 is connected to the other end of the SPI via connecting trace 48. The terminals 38, 42 are used to connect the parallel combination 30 to other elements in a circuit. The entire area of the PCB under the SPI 32 and SIC 40 is devoid of a ground plane. The only required trace is the short signal trace 36 that connects the end of the inner spiral to one of the digits of the SIC 40.

The parallel combination 30 of these elements can be constructed and printed on the PCB so as to form high Q filters that are substantially less sensitive to overetching and underetching of the PCB during manufacturing. The use of the suspended printed inductor whereby the ground plane is eliminated, eliminates the dependency upon the dielectric constant of the PCB substrate material. In addition, the dependency on other parameters of the PCB material such as its thickness is also eliminated. Consequently, a reliable and accurate filter can be constructed at a very low cost having the requisite performance and yield.

As described above, the main characteristic of the parallel addition of the suspended printed interdigital capacitor and suspended printed inductor of the present invention is that the sensitivity of the SPI to fluctuations in PCB etching tolerances is greatly reduced. Further reduction of sensitivity to PCB parameters is achieved by either completely eliminating the ground plane or relocating it to a distance that can be considered virtual infinity, which is a distance much greater than that typically found in microstrip inductors and microstrip interdigital capacitors.

The SIC functions to compensate the SPI for variations in PCB etching, i.e., overetching or underetching. In the case of overetching (i.e., trace width W is narrower than intended), the inductance value of the SPI would normally increase. The effect of overetching on the SIC, however, is to decrease the value of the capacitance of the SIC which compensates for the increase in inductance of the SPI since the resonant frequency is a function of their product. Conversely, in the case of underetching (i.e., trace width W is wider than intended), the inductance value of the SPI would normally decrease. The effect of underetching on the SIC, however, is to increase the value of the capacitance of the SIC which compensates for the decrease in inductance of the SPI.

The advantages of the suspended printed interdigital capacitor are derived from the fact that the area on the bottom layer of the PCB under the SIC is devoid of a ground plane. In particular the advantages include (1) insensitivity to variations in PCB parameters and (2) higher quality factor.

To achieve the benefit of the present invention, each SPI is connected in parallel with a SIC so as to create a parallel LC resonator. The resultant parallel LC resonator is substantially independent of variations in PCB parameters since both the inductor and capacitor are suspended (i.e., have no ground plane). Further, the parallel LC resonator is substantially independent of PCB trace width as well. Thus, a RF filter that is substantially independent of PCB parameters such as PCB thickness and PCB processing (i.e., etching, etc.) can be constructed.

The inductance of the SPI is inversely proportional to its trace width. The wider the trace (which may be caused by underetching), the lower the magnetic flux surrounding the trace and hence, the lower the inductance. The lower the inductance, the higher the resonant frequency. Conversely, the narrower the trace (which may be caused by overetching), the higher the magnetic flux surrounding the trace and hence, the higher the inductance. The higher the inductance, the lower the resonant frequency.

The capacitance of the SIC, on the other hand, is directly proportional to its trace width. The wider the trace, the smaller the distances between the fingers of the capacitor and hence, the higher the capacitance. The higher the capacitance, the lower the resonant frequency. Conversely, the narrower the trace, the larger the distances between the fingers of the capacitor and hence, the lower the capacitance. The lower the capacitance, the higher the resonant frequency.

Thus, the effects of over and underetching on the inductance of the SPI is inversely related to that of the capacitance of the SIC. The effects on the SPI and SIC can be combined in a parallel fashion such that they complement each other. The parallel combination of SPI and SIC can be constructed such that the resonant frequency is nearly independent of the trace width. Thus, the center frequency and the bandwidth of an RF filter (e.g., low pass, high pass, band pass or band stop) constructed therefrom can be adapted, utilizing suitable parallel resonant circuits comprised of SPI and SIC components, to be nearly independent of variations in the PCB etching process.

The resonant frequency $f_c$ of a parallel LC circuit is given by the well known relationship expressed in Equation 1 below.

$$f_c = \frac{1}{2\pi\sqrt{LC}} \qquad (1)$$

where L is the value of the inductance of the SPI and C is the value of the capacitance of the SIC.

With reference to FIG. 3, the substrate, i.e., printed circuit board 34, provides support for the parallel combination of SPI and SIC and can comprise any substrate material having suitable physical and electrical characteristics, e.g., standard printed circuit board material such as FR4. The SPI is constructed by printing a rectangular spiral inductor trace 50 on the printed circuit board material 34. Likewise, the SIC is constructed by printing two sets of fingers 44, 46 on the PCB material 34. The inductor trace 50 and capacitor fingers 44, 46 are printed on one side, i.e. the upper side, of the printed circuit board 34 using standard lithographic techniques well known in the art. The opposite side or lower side of the printed circuit board 34 does not have a ground plane beneath the entire area of the SPI 32 and SIC 40. In operation, annular ground planes surround the rectangular spiral inductor and interdigital capacitor on both sides of the printed circuit board 34.

Optionally, the parallel suspended printed inductor and interdigital capacitor can be constructed with two thin metallic covers (not shown). The two metallic covers are mounted on each side of the printed circuit board and are electrically connected to ground potential. The metallic covers provide effective shielding for the circuitry containing the suspended printed inductor and interdigital capacitor. The ground planes on the printed circuit board are interconnected by via holes. The two metallic covers form the ground planes for the suspended printed inductor and interdigital capacitor that may be used to construct filters or other types of circuitry.

Note, however, that the two metallic covers are constructed such that the ground planes formed by the two covers are located at a typical distance of 5 mm each from the printed circuit board. As is well known in the art of RF circuit design, a ground plane can be considered to be at a distance of virtual infinity for purpose of circuit analysis when it is located at a distance greater than approximately ten times the width of the signal trace. In addition, the relative dielectric constant for the space between the printed trace and the ground planes is equal to 1, i.e., the relative dielectric constant of air. This serves to increase the quality factor Q of the inductor. This, in turn, reduces the insertion loss of a filter constructed using such an inductor. Further, the production yield of a circuit such as a filter that utilizes the parallel combination of suspended printed inductor and interdigital capacitor is greatly increased. This is in comparison with the case where the printed circuit board material itself, e.g., FR4, must be considered. In addition, the performance of any circuit utilizing the parallel combination of suspended printed inductor and interdigital capacitor is more reliable and its electrical parameters are more repeatable.

The parallel resonant combination of SPI and SIC of the present invention can be used to form printed filters, with the SPI and compensating SIC being basic elements of the filter. The SPI itself can be any type of printed inductor, e.g., spiral inductor, serpentine line inductor or a transmission line inductor, having a ground plane located at a distance of virtual infinity, which is a distance significantly greater than that typically found in microstrip filters. In addition, the suspended printed inductor can be implemented in various types of filters, for example, band pass, high pass, low pass, band stop or any combination thereof. Further, the filters can be constructed using the suspended printed inductor in semi lumped networks together with different types of capacitors (other than the capacitor used for compensation purposes), for example, SMD ceramic, thin film, printed MIM or interdigital printed capacitors. In addition, the suspended printed inductor can be utilized to realize a transformer by printing two spiral inductors on both sides of a printed circuit board (not shown).

The main advantage of the parallel resonant circuit of SPI and SIC is that it can be used to realize filters whose center frequency is nearly independent of variations in the PCB etching process. Another important advantage of it is that a high quality factor Q is achievable even when low cost printed circuit board materials are used.

The SPI and SIC combination can be implemented on readily available commercial printed circuit board material such as FR4 glass epoxy while achieving a quality factor Q up to ten times higher than that of a microstrip inductor implemented on the same material while being nearly insensitive to variations in the PCB etching process. This dramatic improvement in the quality factor Q is due to the improvement in the value of the loss tangent (tanδ), i.e., loss factor, of the media surrounding the inductor period. Considering the use of common FR4 printed circuit board material, the loss factor for a suspended printed inductor is on the order of 10⁻ as compared to 0.02 for a conventional microstrip inductor.

SPIs and SICs have the advantage of improved repeatability of the inductance and capacitance values, respectively. Conventional microstrip inductors and interdigital capacitors are typically very sensitive to the parameters of the material used to construct the printed circuit board. Standard commercial printed board material such as FR4 glass epoxy, has a tolerance of +/−10% in their thickness. In addition, the dielectric constant of the printed circuit board material varies. Thus, microstrip inductors and interdigital capacitors constructed on PCBs are sensitive to both the thickness of the PCB and its dielectric constant. Commercial FR4 PCB material has a wide range of variation in its relative dielectric constant, which typically ranges between 4.5 and 5. This causes relatively large variations in the resultant self resonant frequency of the inductors since the self resonant frequency is strongly dependent upon the dielectric constant of the printed circuit board material. Considering frequencies on the order of the self resonant frequency, the variations in the relative dielectric constant ($\in_r$) cause variations in the value of the inductor and interdigital capacitors, which in turn, result in a filter having relatively large frequency response errors.

The problems described above do not occur with the parallel combination of SPI and SIC where the ground plane under the inductor and capacitor is eliminated, i.e., moved to a distance of virtual infinity. The ground plane under the inductor and capacitor can be eliminated by suitably laying out the one or more layers under the SPI and SIC to be devoid of any electrical traces, including power, ground and signal traces.

The actual dielectric constant value for a SPI is very close to 1 as is the case for air inductors. Since the dielectric constant for air is relatively constant, the repeatability of the inductance value is greatly improved with the subsequent increase in the production yield of any filters constructed using the SPI.

Yet another advantage of the suspended printed inductors is that the self resonant frequency is much higher than that of comparable microstrip inductors. The self resonant frequency of a suspended printed inductor is higher due to the lower parasitic capacitance of the SPI. The SPI is characterized by low parasitic capacitance due to the combination of a lower dielectric constant and a larger distance to the ground plane. This permits higher inductance values to be achieved with reasonable dimensions while remaining at a safe frequency distance from the self resonant frequency.

Another advantage of suspended printed inductors is the low cost compared with lumped element inductors. Utilizing suspended printed inductors in filter circuits eliminates the high cost traditionally associated with high accuracy, high quality factor Q lumped coils. The relatively expensive high quality factor Q lumped coils are replaced with suspended printed inductors which comprise printed patterns on a printed circuit board which have high accuracy and negligible cost.

Figure 4:
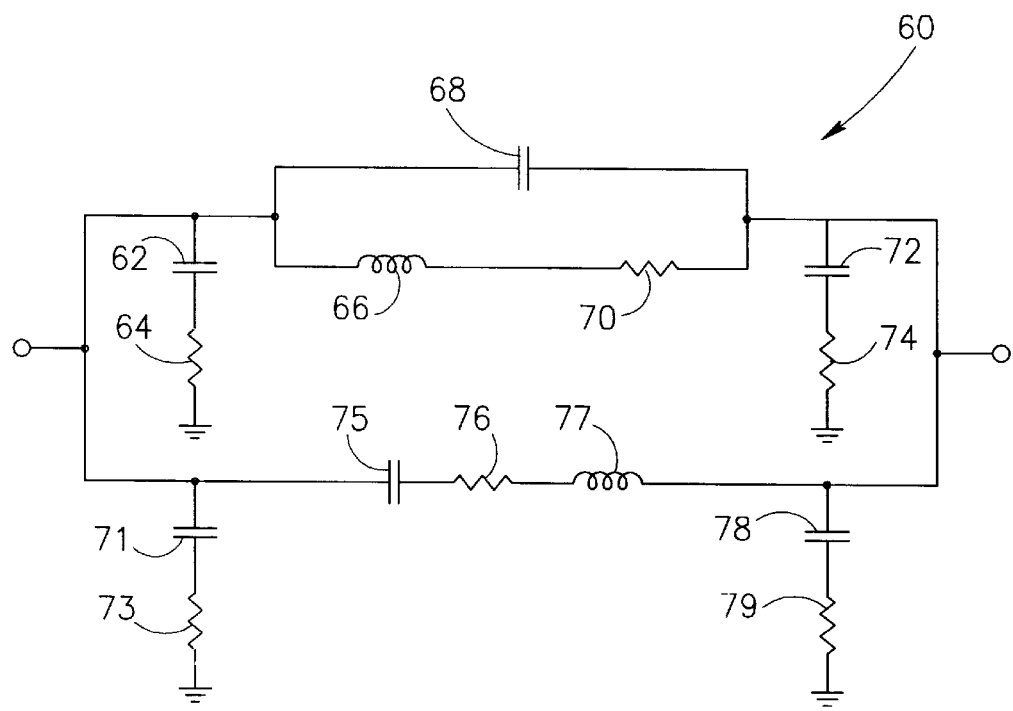
FIG. 4 is a schematic diagram illustrating the equivalent circuit for a prior art parallel microstrip inductor and capacitor having a ground plane.

A schematic diagram illustrating the equivalent circuit for a prior art parallel microstrip inductor and capacitor having a ground plane is shown in FIG. 4. The equivalent inductor circuit, generally referenced 60, comprises a capacitor 68 in parallel with the combination of an inductor 66 in series with a resistor 70. Inductor 66 represents the inductance of the microstrip inductor while resistor 70 is the series resistance resulting from the losses in the copper tracing. In addition, capacitor 68 represents the parasitic capacitance between the turns of the inductor.

The combination of capacitor 68, inductor 66 and resistor 70 is connected between two series connections of capacitor 62/resistor 64 and capacitor 72/resistor 74. Capacitors 62, 72 represent the capacitance between the turns of the inductor and the ground plane. Resistors 64, 74 represent the resistance due to the dielectric loss of the printed circuit board material. Note that if the dielectric loss of the printed circuit board material is relatively high (lossy) the resistance losses can be quite high.

Connected in parallel inductor 66/resistor 70 is a series RLC representing the contribution of the fingers of the microstrip interdigital capacitor. The series RLC comprises capacitor 75 representing the fringe capacitance between capacitor fingers, resistor 76 representing the parasitic resistance of the fingers and inductance 77 represents the parasitic inductance of the fingers. Capacitors 71, 78 represent the parasitic capacitance of the fingers to ground and resistors 73, 79 represent the dielectric loss of the printed circuit board material.

Figure 5:
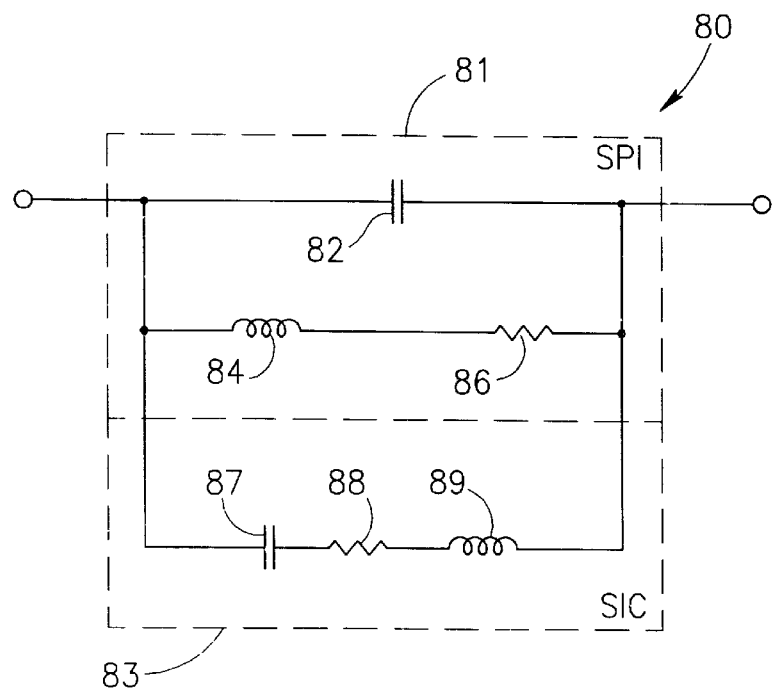
FIG. 5 is a schematic diagram illustrating the equivalent circuit for the parallel combination of a suspended printed inductor and interdigital capacitor of the present invention.

A schematic diagram illustrating the equivalent circuit for the parallel combination of a suspended printed inductor and interdigital capacitor of the present invention is shown in FIG. 5. The circuit model, generally referenced 80, is divided into two portions with portion 81 representing the contribution due to the SPI and portion 83 representing the portion due to the SIC. Since both the inductor and compensating capacitor are suspended, the shunt element capacitors 62, 72, 71, 78 and resistors 64, 74, 73, 79 are of negligible effect due to the ground plane being located at a distance of virtual infinity.

The SPI portion 81 comprises capacitor 82, inductor 84 and resistor 86. The SIC portion comprises capacitor 87, resistor 88 and inductor 89. Due to the location of the ground plane at virtual infinity the shunt elements have been eliminated from the model and the combination of suspended printed inductor with suspended interdigital capacitor can be modeled simply as a capacitor in parallel with the series combination of an inductor and a resistor and a series RLC.

The resistance 86 represents the parasitic resistance of the inductor including the copper losses, thickness of the copper material and the skin effect of the surface of the copper trace.

Capacitor 87 represents the fringe capacitance between the fingers of the interdigital capacitor, resistor 88 represents the parasitic resistance of the fingers and inductance 89 represents the parasitic inductance of the fingers.

Figure 6:
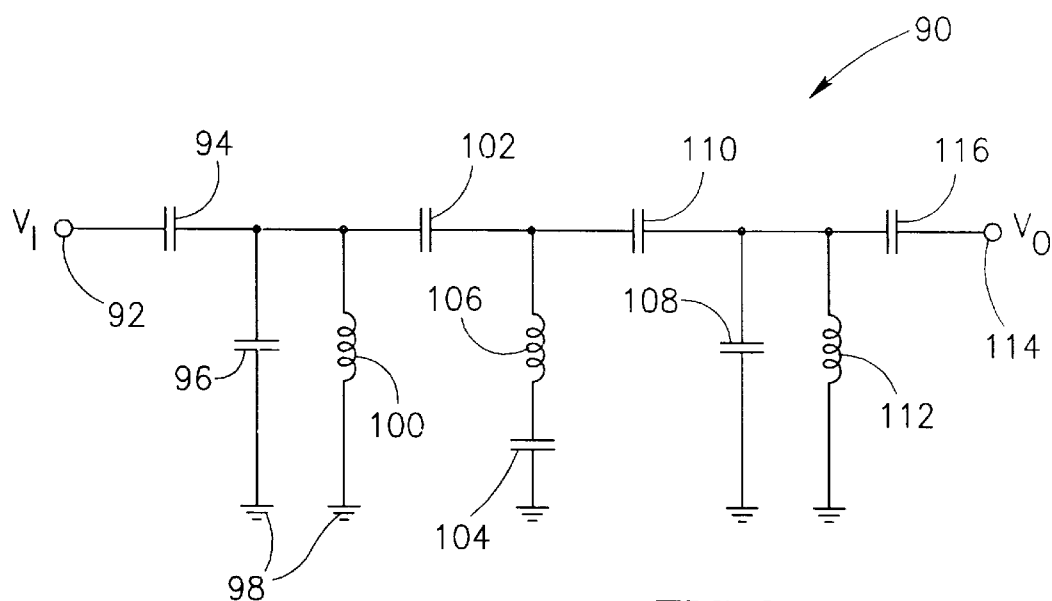
FIG. 6 is a schematic diagram illustrating an RF filter circuit constructed using suspended printed inductors without compensating suspended printed interdigital capacitors.

A schematic diagram illustrating a RF filter circuit constructed using suspended printed inductors without compensating suspended printed interdigital capacitors is shown in FIG. 6. The RF filter, generally referenced 90, is an LC type third order band pass filter having two poles and one zero. It is constructed using two parallel LC resonators and one series LC combination coupled by standard SMD ceramic capacitors. The circuit comprises suspended printed inductors 100, 106, 112 and capacitors 94, 102, 110, 116, 96, 104, 108. Terminal 92 serves as the input terminal for the input voltage $V_I$. Terminal 114 serves as the output terminal for output voltage $V_O$.

Each of the LC resonators comprises a suspended printed inductor in parallel with a capacitor. Each suspended printed inductor is resonated by a conventional capacitor such as a standard low cost SMD capacitor. Optionally, more than one capacitor may be used in each resonator to obtain non standard values of capacitance where each capacitor has a standard value. One of the capacitors used may be a tunable trimming capacitor that is useful to permit. adjustments to be made at production time. In the example filter circuit shown in FIG. 6, a single fixed capacitor is used in constructing each resonator. The input coupling capacitor 94 and an output coupling capacitor 116 comprise conventional ceramic capacitors such as standard SMD ceramic capacitors. In addition, the filter including the suspended inductors is printed on low cost standard printed circuit board material such as FR4.

The example band pass filter shown is suitable for use in the ISM band of 902 to 928 MHz. The width W of the traces used to form the SPIs is 0.25 mm and the spacing S between traces is 0.2 mm. The center frequency is 915 MHz.

The typical specifications for the third order band pass filter of FIG. 6 are listed below:

Center Frequency: 915 MHz

Minimal Relative 3 dB Bandwidth: 3%

Maximum Insertion Loss at Center Frequency: 3dB

Capacitor Tolerance: 2%

PCB Area Used: up to 9×9 mm

Estimated Cost: cost of PCB material plus seven 2% capacitors

Note that a higher order filter might require trimming at the time of production, depending on the tolerance of the filter's elements. It is appreciated by those skilled in the RF filter art that this type of filter is ideal as a band pre-selector filter where it is responsible for rejecting out of band interference or as a first IF filter in a dual conversion receiver where the filter is responsible for rejecting inband interference. The second IF filter in such a receiver would usually be a standard ceramic filter, SAW device or crystal filter (depending on the frequency and bandwidth of the IF) having an extremely steep frequency response. Such a filter could perform noise limiting and would determine the selectivity of the receiver, i.e., adjacent channel rejection in a multi-channel environment.

Note that a filter based on the suspended printed inductor may be constructed to have a notch (band reject) within its response. This is useful in cases where interference is expected at certain known bands adjacent to the band of the filter, e.g., the interference from cellular telephones in the 800 to 900 MHz band to systems in the ISM band of 902 to 928 MHz. Using a filter with a notch could further improve the overall performance of the receiver in comparison with one based on a simple band pass filter having limited out of band attenuation.

It is appreciated by those skilled in the RF filter arts that high pass and low pass sections can be added to the filter of FIG. 6, just as would be the case with conventional LC based filters. The only substantial consideration in such a design is the PCB area occupied by the filter and the cost of additional capacitors for the LC sections added.

Figure 7:
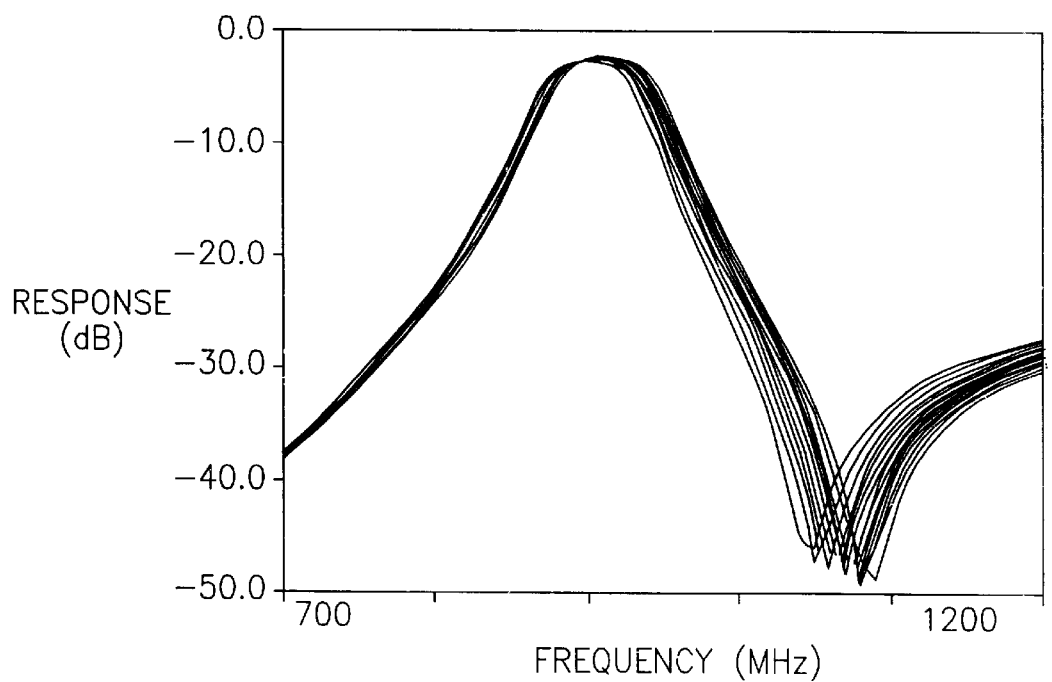
FIG. 7 is a graph illustrating the statistical spread of the frequency characteristics of the filter shown in FIG. 6.

A graph illustrating the statistical spread of the frequency characteristics of the filter shown in FIG. 5 realized using prior art microstrip inductors without compensating capacitors is shown in FIG. 7. The plurality of curves represent the response as a function of frequency of the SPI based band pass filter constructed without compensating SICs. The curves (which are standard $S_{21}$ responses) represent the results of a statistical analysis that was performed by applying a Gaussian distribution to the trace width with a standard deviation of ±10%. The results were simulated using HP EEsof circuit simulation software from Hewlett Packard.

The curves show the relatively large variation in center frequency and the even larger variation in the notch between 1000 to 1100 MHz. The large variation is due to the varying width of the traces making up the SPI.

Figure 8:
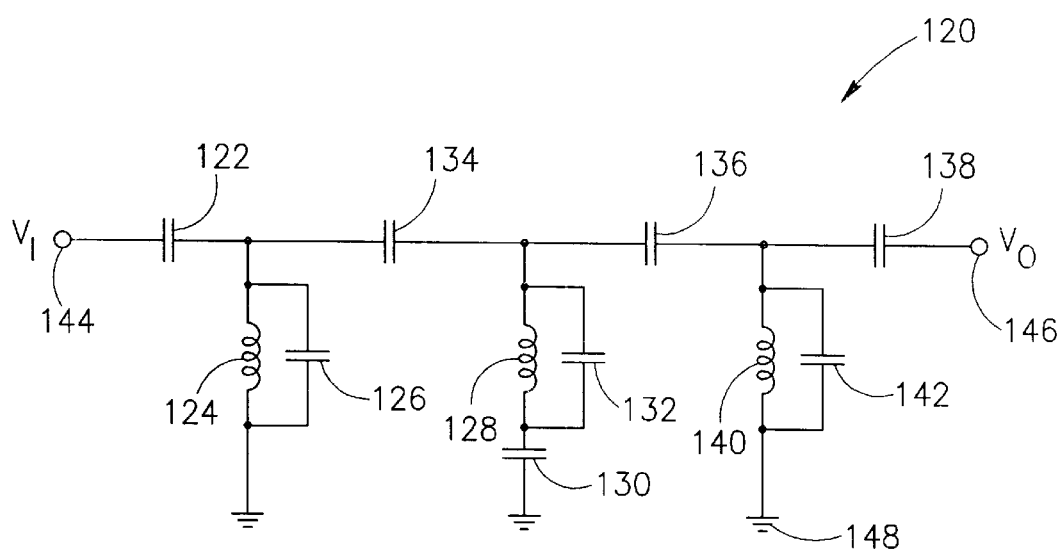
FIG. 8 is a schematic diagram illustrating an RF filter circuit constructed using suspended printed inductors with compensating suspended printed interdigital capacitors.

A schematic diagram illustrating a prior art RF filter circuit constructed using suspended printed inductors with compensating suspended printed interdigital capacitors is shown in FIG. 8. The RF filter, generally referenced 120, is similar in construction to the filter of FIG. 6 with the addition of compensating SICs. Each SPI of the filter of FIG. 6 is replaced with a parallel resonant combination of SPI and SIC. The filter 120 is an LC type third order band pass filter having two poles and one zero. It is constructed using two parallel LC resonators and one series LC combination coupled by standard SMD ceramic capacitors. The circuit comprises suspended printed inductors 124, 128, 140 in parallel with SICs 126, 132, 142, respectively, ground 148 and capacitors 122, 134, 136, 138. Terminal 144 serves as the input terminal for the input voltage $V_I$. Terminal 146 serves as the output terminal for output voltage $V_O$. Each of the LC resonators comprises a suspended printed inductor in parallel with a capacitor. Each suspended printed inductor is resonated by a SIC.

In accordance with the present invention, the parameters of the SICs have been optimized so as to reduce to a minimum the sensitivity of the center frequency of the band pass filter 120 to variations in PCB trace width.

The example band pass filter shown is suitable for use in the ISM band of 902 to 928 MHz. The width W of the traces used to form the SPIs is 0.25 mm and the spacing S between traces is 0.2 mm. The center frequency is 915 MHz.

Figure 9:
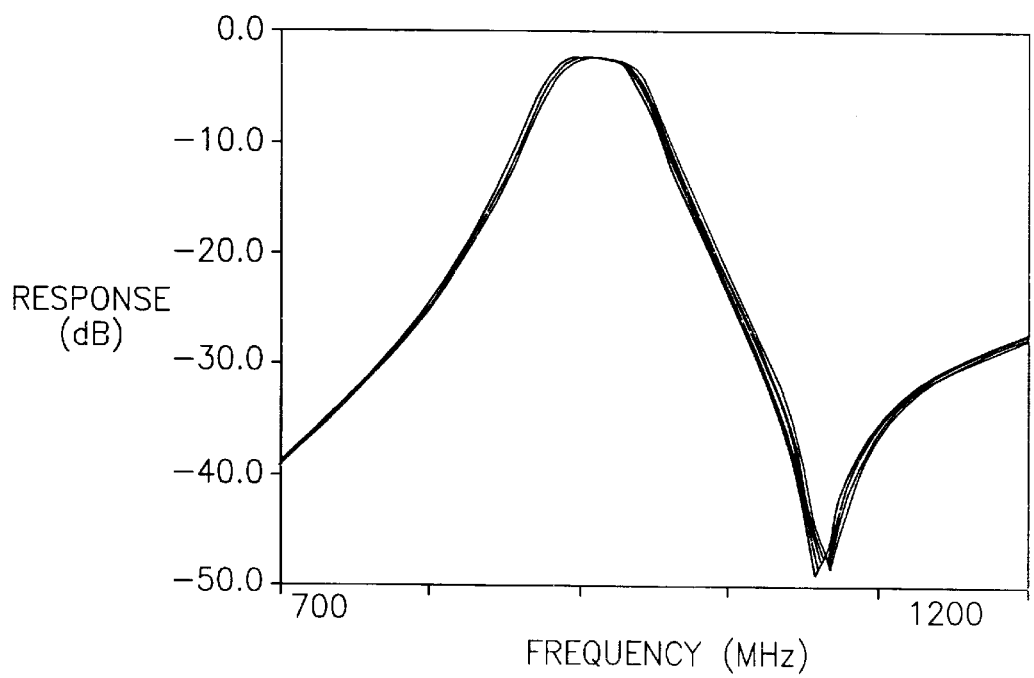
FIG. 9 is a graph illustrating the reduced statistical spread of the frequency characteristics of the filter shown in FIG. 8.

A graph illustrating the reduced statistical spread of the frequency characteristics of the filter shown in FIG. 8 realized using suspended printed inductors with compensating suspended printed interdigital capacitors is shown in FIG. 9. The plurality of curves represent the response as a function of frequency of the parallel resonant SPI/SIC based band pass filter constructed with compensating SICs. The curves (which are standard $S_{21}$ responses) represent the results of a statistical analysis that was performed by applying a Gaussian distribution to the trace width with a standard deviation of ±10%. The results were simulated using HP EEsof circuit simulation software from Hewlett Packard. The optimal value of the capacitance C was found that best compensates the inductance L to variations in trace width W.

The curves show the relatively little variation in center frequency and very little variation in the notch between 1000 to 1100 MHz. Comparing the response in FIG. 9 to that of FIG. 7, it can be seen that the statistical spread of the central frequency of the band pass filter is significantly less in the band pass filter constructed using the parallel resonant combination of SPI and SIC. Note that the parameters of the SIC may be varied to increase or decrease the desired capacitance. The capacitance can be increased by (1) increasing the number N of fingers of the SIC, (2) increasing the width W, (3) decreasing the space S, and (4) increasing the length L of the fingers.

Figure 10:
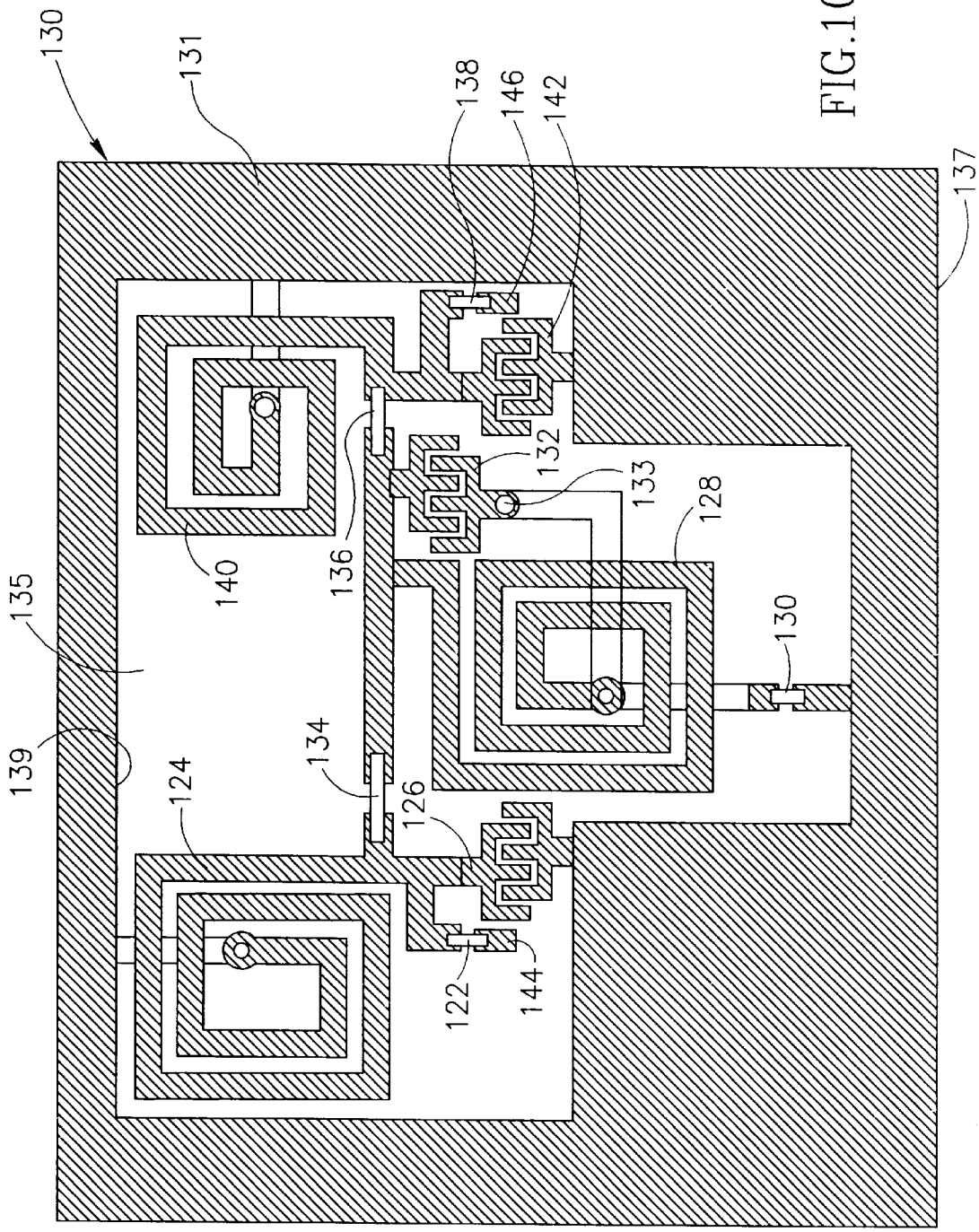
FIG. 10 is a PCB layout diagram of the RF filter circuit illustrated in FIG. 8.

A PCB layout diagram of the RF filter circuit illustrated in FIG. 8 is shown in FIG. 10. For clarity sake, similar components in both FIGS. 8 and 10 have the same reference numeral. The circuit, generally referenced 130, is constructed on a PCB 137 comprising at least an upper layer and a lower layer. Input terminal 144 receives an input while the output terminal 146 connects to next stage circuitry. The circuit comprises capacitors 122, 134, 136, 130 and 138, suspended printed inductors 124, 128 and 140 and suspended printed interdigital capacitors 126, 132 and 142. In accordance with the present invention, the entire area within the border 139 of the filter circuit is devoid of a ground plane. The ground plane 131 may be situated on the upper or lower layers or both and does not play a role in the operation of the SPI or SIC components. The signal passes from one layer to another by way of vias 133. The operation of the filter circuit is as described hereinabove in connection with FIG. 8 and is not repeated here.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

For example, the SPI and SIC components and the resulting example filters constructed therefrom described hereinabove, may be realized utilizing well known integrated circuit fabrication techniques. In particular, the suspended printed inductor and suspended interdigital capacitor may be fabricated using Silicon or GaAs substrates. Note, however, that some IC technologies dictate the use of a ground plane under the inductor and interdigital capacitor. In the event there is a ground plane, the use of the interdigital capacitor in parallel with inductors is still an effective technique for reducing the effects of circuits to variations in the IC signal trace width.

What is claimed is:

1. A suspended printed resonant circuit, comprising:
   a substrate onto which circuit elements can be printed;
   a first electrically conductive trace printed onto said substrate, said first electrically conductive trace shaped so as to form an inductor at high radio frequencies of interest;
   a second electrically conductive trace printed onto said substrate, said second electrically conductive trace shaped so as to form an interdigital capacitor at the high radio frequencies of interest, said interdigital capacitor electrically connected in parallel to said inductor so as to form a parallel resonant circuit, the resonant frequency of said parallel resonant circuit being substantially independent of variations in the width of said first electrically conductive trace and said second electrically conductive trace; and
   wherein an area of said substrate underlying entirely said first electrically conductive trace and said second electrically conductive trace is devoid of electrical traces extending into said area from an area of said substrate external to said area of said substrate underlying said first electrically conductive trace and said second electrically conductive trace.

2. The circuit according to claim 1, wherein said substrate comprises printed circuit board material.

3. The circuit according to claim 2, wherein said printed circuit board material comprises FR4 material.

4. The circuit according to claim 2, wherein said printed circuit board material comprises polyimide material.

5. The circuit according to claim 1, wherein said substrate comprises ceramic.

6. The circuit according to claim 1, wherein said substrate comprises Silicon and wherein said resonant circuit is fabricated utilizing Silicon Integrated Circuit techniques.

7. The circuit according to claim 1, wherein said substrate comprises GaAs and wherein said resonant circuit is fabricated utilizing GaAs Integrated Circuit techniques.

8. The circuit according to claim 1, wherein said first electrically conductive material and said second electrically conductive material comprise copper or an alloy thereof.

9. The circuit according to claim 1, wherein said first electrically conductive material and said second electrically conductive material comprise aluminum or an alloy thereof.

10. The circuit according to claim 1, wherein said printed inductor has the shape of a rectangular spiral.

11. The circuit according to claim 1, further comprising a pair of metallic covers positioned to sandwich said suspended printed inductor, said pair of metallic covers electrically connected to ground potential and functioning to shield said suspended printed inductor from external electromagnetic radiation, each metallic cover located at a distance from said suspended printed inductor sufficiently large to be considered virtual infinity.

12. The circuit according to claim 1, wherein the width of said first electrically conductive trace and said second electrically conductive trace is on the order of 0.5 mm.

13. The circuit according to claim 1 wherein said area of said substrate underlying said first electrically conductive trace and said second electrically conductive trace is devoid of a ground plane.

14. A radio frequency (RF) filter having an input and an output, said filter for filtering an input signal to yield an output signal therefrom, said filter comprising:
  a substrate onto which circuit elements can be printed;
  a filter circuit comprising at least two parallel resonant circuits, each of said parallel resonant circuits comprising a suspended printed inductor in parallel with a suspended interdigital capacitor, wherein said parallel resonant circuit is devoid of electrical traces extending into an area of said substrate underlying entirely said inductor and said capacitor from an area of said substrate external to said area of said substrate underlying said inductor and said capacitor, and further wherein the resonant frequency of said parallel resonant circuit is substantially independent of variations in the width of the traces used to construct said suspended printed inductor and said suspended interdigital capacitor;
  coupling means for electrically coupling said parallel resonant circuits to one another;
  input coupling means for coupling said input signal to said filter circuit; and output coupling means for coupling said filter circuit to said output thus forming said output signal.

15. The filter according to claim 14, wherein said printed circuit board material comprises FR4 material.

16. The filter according to claim 14, wherein said substrate comprises glass.

17. The filter according to claim 14, wherein said substrate comprises plastic.

18. The filter according to claim 14, wherein said substrate comprises ceramic.

19. The filter according to claim 14, wherein said substrate comprises Silicon and wherein said filter circuit is fabricated utilizing Silicon Integrated Circuit techniques.

20. The filter according to claim 14, wherein said substrate comprises GaAs and wherein said filter circuit is fabricated utilizing GaAs Integrated Circuit techniques.

21. The filter according to claim 14, wherein each pole comprises:
  a first electrically conductive trace printed onto said substrate so as to form an inductor at high frequencies of interest;
  a second electrically conductive trace printed onto said substrate so as to form an interdigital capacitor at the RF frequencies of interest; and
  wherein an area of said substrate underlying said first electrically conductive trace and said second electrically conductive trace is devoid of electrical traces, including power, ground and signal traces.

22. The filter according to claim 14, wherein said coupling means comprises a capacitor.

23. The filter according to claim 14, wherein said input coupling means comprises a capacitor.

24. The filter according to claim 14, wherein said output coupling means comprises a capacitor.

25. The filter according to claim 14, wherein said suspended printed inductor is substantially shaped as a rectangular spiral.

26. The filter according to claim 14, wherein said substrate comprises printed circuit board material.

27. The circuit according to claim 14 wherein said parallel resonant circuit is further devoid of any ground plane extending into an area of said substrate underlying said inductor and said capacitor.

28. A method of fabricating a suspended printed resonant circuit, said method comprising the steps of:
  providing a substrate onto which circuit elements can be printed;
  printing onto said substrate, a first electrically conductive trace using lithographic techniques such that said first electrically conductive trace functions as an inductor at RF frequencies of interest;
  printing onto said substrate, a second electrically conductive trace using lithographic techniques such that said second electrically conductive trace functions as an interdigital capacitor at the RF frequencies of interest and such that said interdigital capacitor is electrically connected in parallel to said inductor so as to form a parallel resonant circuit; and
  creating an area on said substrate underlying entirely said first electrically conductive trace and said second electrically conductive trace that is devoid of electrical traces extending into said area from an area of said substrate external to said area of said substrate underlying said first electrically conductive trace and said second electrically conductive trace.

29. The method according to claim 28, wherein said substrate comprises Silicon and wherein said resonant circuit is fabricated utilizing Silicon Integrated Circuit techniques.

30. The method according to claim 28 wherein said substrate comprises GaAs and wherein said resonant circuit is fabricated utilizing GaAs Integrated Circuit techniques.

31. The method according to claim 28 wherein said area of said substrate underlying said first electrically conductive trace and said second electrically conductive trace is devoid of a ground plane.

* * * * *